(12) United States Patent
Kim et al.

(10) Patent No.: US 10,943,899 B2
(45) Date of Patent: Mar. 9, 2021

(54) SEMICONDUCTOR DEVICE

(71) Applicant: SAMSUNG ELECTRONICS CO., LTD., Suwon-si (KR)

(72) Inventors: Su Jeong Kim, Seoul (KR); In Mo Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 16/395,467

(22) Filed: Apr. 26, 2019

(65) Prior Publication Data

US 2020/0135716 A1    Apr. 30, 2020

(30) Foreign Application Priority Data

Oct. 30, 2018    (KR) .................... 10-2018-0130881

(51) Int. Cl.
| | | |
|---|---|---|
| *H01L 27/06* | (2006.01) | |
| *H01L 27/02* | (2006.01) | |
| *H01L 27/088* | (2006.01) | |

(52) U.S. Cl.
CPC ...... *H01L 27/0629* (2013.01); *H01L 27/0288* (2013.01); *H01L 27/088* (2013.01); *H01L 27/0207* (2013.01)

(58) Field of Classification Search
CPC ............. H01L 27/0629; H01L 27/0288; H01L 27/088; H01L 27/0207
See application file for complete search history.

(56) References Cited

U.S. PATENT DOCUMENTS

| | | | |
|---|---|---|---|
| 6,034,433 A | 3/2000 | Beatty | |
| 6,194,233 B1 | 2/2001 | Bedner et al. | |
| 6,557,155 B2 | 4/2003 | Nagayoshi et al. | |
| 6,683,351 B2 | 1/2004 | Morita et al. | |
| 6,815,771 B2 | 11/2004 | Kimura | |
| 8,872,269 B2 | 10/2014 | Yang et al. | |
| 8,912,582 B2 | 12/2014 | Reisiger | |
| 9,490,245 B1 | 11/2016 | Sahu et al. | |
| 2014/0159157 A1 | 6/2014 | Jensen et al. | |
| 2014/0284754 A1* | 9/2014 | Yamamoto | H01L 23/5223 257/487 |
| 2015/0243612 A1* | 8/2015 | Yamamoto | H01L 21/78 257/693 |
| 2018/0054167 A1* | 2/2018 | Cheng | H03G 3/3042 |
| 2018/0062636 A1* | 3/2018 | Dabag | H03K 17/063 |

FOREIGN PATENT DOCUMENTS

| | | |
|---|---|---|
| JP | 2000-236027 A | 8/2000 |
| JP | 2005-158859 A | 6/2005 |
| JP | 2007-158004 A | 6/2007 |
| JP | 2008-311285 A | 12/2008 |
| JP | 2018-64008 A | 4/2018 |
| KR | 10-2014-0111897 A | 9/2014 |

* cited by examiner

*Primary Examiner* — Nathan W Ha
(74) *Attorney, Agent, or Firm* — Sughrue Mion, PLLC

(57) ABSTRACT

A semiconductor device includes a guard active area formed in a substrate, a plurality of transistors disposed in an element area adjacent to the guard active area, each of the transistors including an active area and a gate structure crossing the active area, and a diode transistor disposed between a first transistor and a second transistor among the transistors, and having a diode gate structure connected to the guard active area, a first active area connected to a gate structure of the first transistor, and a second active area connected to a gate structure of the second transistor.

20 Claims, 15 Drawing Sheets

IV-IV'

SEMICONDUCTOR DEVICE

CROSS-REFERENCE TO RELATED APPLICATION

This application claims the priority and benefit from Korean Patent Application No. 10-2018-0130881, filed on Oct. 30, 2018, with the Korean Intellectual Property Office, the inventive concept of which is incorporated herein by reference.

BACKGROUND

1. Field

Apparatuses and methods consistent with example embodiments of the present inventive concept relate to a semiconductor device.

2. Description of Related Art

A manufacturing process of a semiconductor device includes a plurality of unit processes, and various methods have been proposed for protecting already formed semiconductor elements while the plurality of unit processes are performed. Various protection elements may be additionally formed in a semiconductor substrate for the purpose of significantly reducing the damage which the already formed semiconductor packages by the unit processes may suffer. However, considering the necessity of disposing as many semiconductor elements as possible in a limited area, a problem in which the degree of integration of the semiconductor devices is lowered due to the disposition of protection elements or the degree of freedom of design is reduced, or the like, may occur.

SUMMARY

Example embodiments of the inventive concept provide a semiconductor device capable of increasing the degree of freedom of a layout design and preventing damage to gate electrodes by providing a diode for protecting a plurality of transistors in a transistor form.

According to an aspect of example embodiments, there is provided a semiconductor device which may include: a guard active area formed in a substrate; a plurality of transistors disposed in an element area adjacent to the guard active area, each of the transistors including an active area and a gate structure crossing the active area; and a diode transistor disposed between a first transistor and a second transistor among the transistors, and having a diode gate structure connected to the guard active area, a first active area connected to a gate structure of the first transistor, and a second active area connected to a gate structure of the second transistor.

According to an aspect of example embodiments, there is provided a semiconductor device which may include: a guard active area formed in a substrate; a first transistor adjacent to the guard active area in a first direction, and including an active area and a gate structure crossing the active area; and a diode transistor adjacent to the first transistor in a second direction crossing a first direction, and including a diode gate structure extending in the first direction and connected to the guard active area; and a first active area disposed between the diode gate structure and the first transistor and connected to the gate structure of the first transistor.

According to an aspect of example embodiments, there is provided a semiconductor device which may include: a substrate; a plurality of transistors formed in the substrate, and including an active area doped with a first conductivity type impurity and a gate structure crossing the active area; a guard active area formed in the substrate to be adjacent to the transistors, and doped with the first conductivity type impurity; and a diode transistor. The diode transistor may include: a diode gate structure connected to the guard active area; and a first active area and a second active area disposed opposite sides of the diode gate structure, and configured to pass a current generated by plasma ions to the substrate.

BRIEF DESCRIPTION OF DRAWINGS

The above and other aspects, features, and advantages will be more clearly understood from the following detailed description taken in conjunction with the accompanying drawings, in which.

DETAILED DESCRIPTION

Hereinafter, various embodiments will be described with reference to the accompanying drawings. The embodiments described herebelow are all exemplary, and thus, the inventive concept is not limited to these embodiments disclosed below and may be realized in various other forms. It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Figure 1:
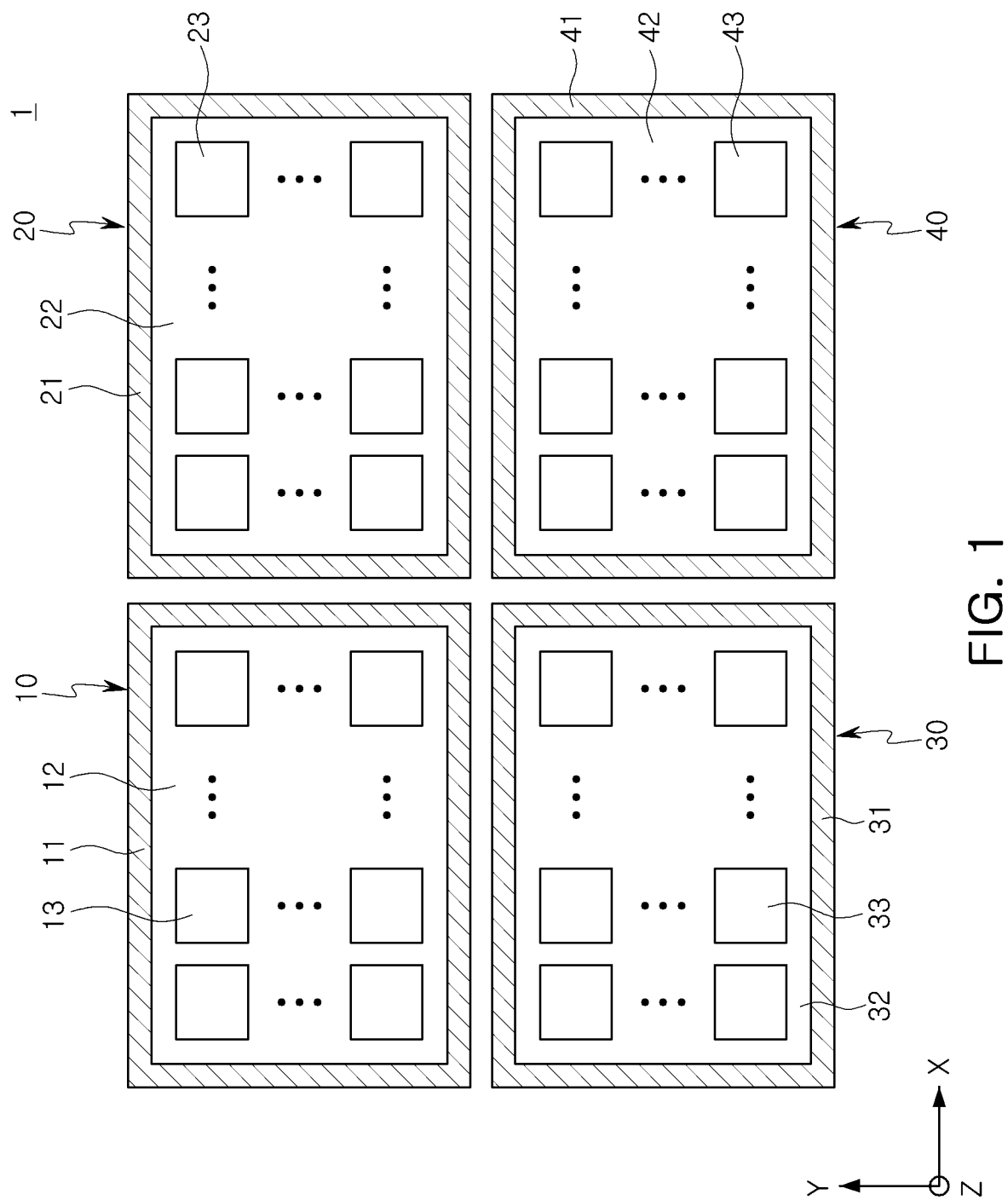
FIG. 1 is a plan view illustrating a semiconductor device according to an example embodiment.

FIG. 1 is a simplified plan view illustrating a semiconductor device according to an embodiment.

Referring to FIG. 1, a semiconductor device 1 according to an example embodiment may include a plurality of areas 10 to 40. The areas 10 to 40, adjacent to each other in a first direction (X-axis direction) and/or a second direction (Y-direction), may include a well area doped with impurities of different conductivity types. For example, the first area 10 and the fourth area 40 may include a P-well area in which NMOS transistors are formed, and the second area 20 and the third area 30 may include an N-well area in which PMOS transistors are formed.

To prevent interference between the well areas doped with impurities of different conductivity types, the plurality of areas 10 to 40 may be surrounded by guard active areas 11 to 41. The guard active areas 11 and 41 of the first area 10 and the fourth area 40 may be formed by doping the P-well area in each of the first area 10 and the fourth area 40 with an N-type impurity, and may be connected to a ground voltage. The guard active areas 21 and 31 of the second area 20 and the third area 30 may be formed by doping the N-well area in each of the second area 20 and the third area 30 with a P-type impurity, and may be connected to a voltage higher than the ground voltage.

By the guard active areas 11 to 41, element areas 12 to 42 in which a plurality of semiconductor elements 13 to 43 may be defined. The kind of the plurality of semiconductor elements 13 to 43 formed in the element areas 12 to 42 may be determined by the conductivity type of the well area formed in each of the plurality of areas 10 to 40.

The plurality of semiconductor elements 13 to 43 may include transistors having a gate structure and an active area. The gate structure may be erected in a direction perpendicular to an upper surface of a semiconductor substrate on which the semiconductor device 1 is formed. To prevent the gate structure from collapsing in subsequent processes performed after the active area, the gate structure, and the like are formed, the gate structure may have to be disposed at predetermined reference intervals. In addition, a diode connected to the gate structure may be formed to prevent damage to the gate structure caused in a process of manufacturing the semiconductor device 1 using plasma, or the like.

The diode connected to the gate structure may be an antenna diode providing a path of charges generated by discharge in the manufacturing process using plasma, or the like. The antenna diode may be connected to the semiconductor substrate, and therefore, charges, currents, and the like generated by the discharge may flow to the semiconductor substrate, such that breakage of the gate structure may be prevented.

In general, the antenna diode may be formed by forming a separate diode active area from the plurality of semiconductor elements 13 to 43 and extending and connecting the gate structure to the diode active area. When the diode active area is formed between the semiconductor elements 13 to 43 in the first direction (X-axis direction), an interval between the gate structures included in the semiconductor elements 13 to 43 may be distant by the diode active area. Therefore, a portion of the gate structures may collapse in a subsequent process. To solve this problem, a dummy gate structure adjacent to the diode active area may be formed, in which case, however, the degree of integration of the semiconductor elements 13 to 43 may be lowered. In addition, when the diode active area is formed between the semiconductor elements 13 to 43 in the second direction (Y-axis direction), the degree of integration of the semiconductor elements 13 to 43 in the second direction may be lowered.

In embodiments, to solve the above-described problems, an antenna diode may be formed between a portion of the plurality of semiconductor elements 13 to 43 in the form of a transistor. Accordingly, the interval between the gate structures may be kept under a predetermined reference interval, such that the gate structure may prevent from collapsing in a subsequent process, and a problem in which the degree of integration of the semiconductor elements 13 to 43 may also be solved.

Figure 2:
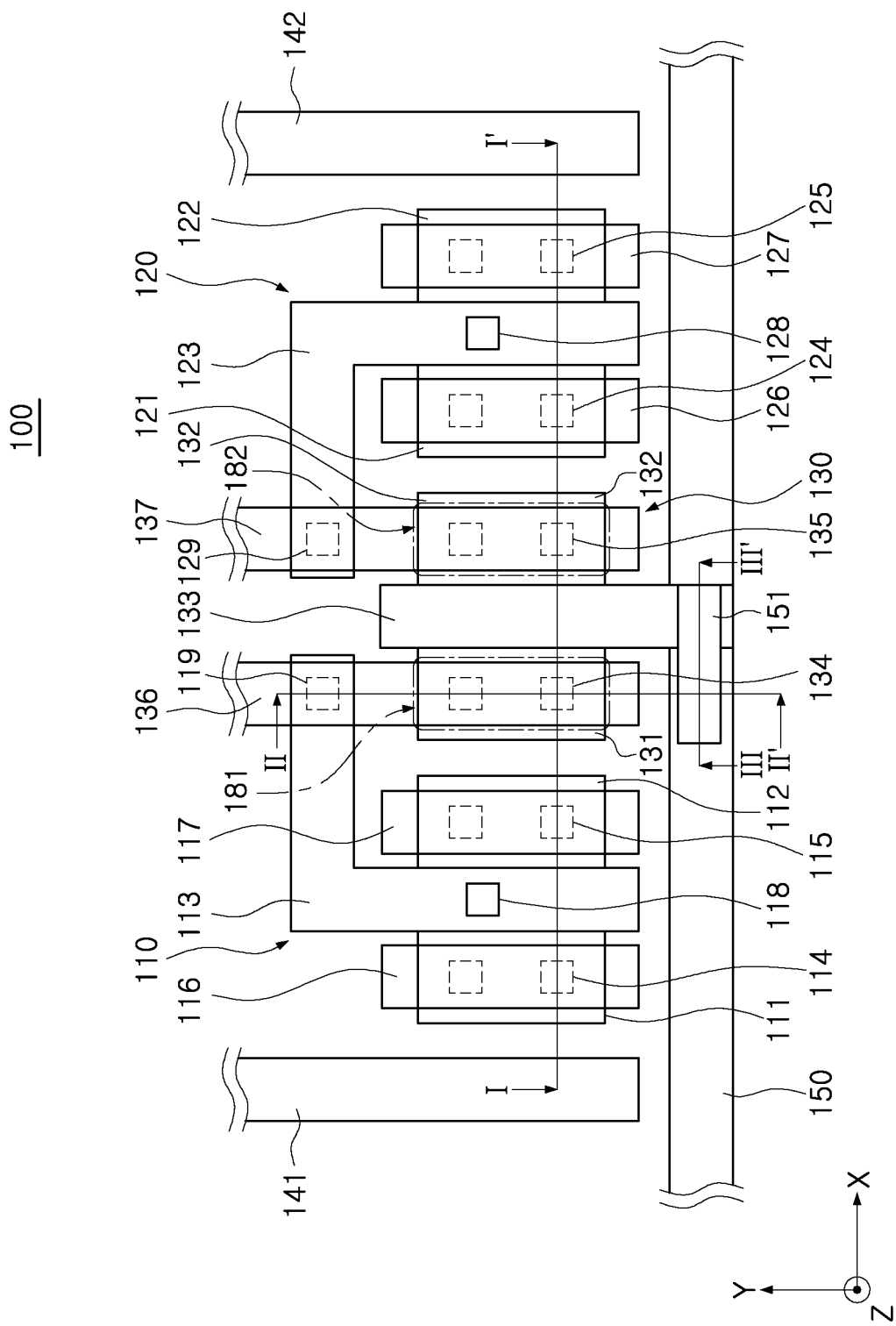
FIG. 2 is a plan view illustrating a partial area of a semiconductor device according to an example embodiment.

FIG. 2 is a plan view illustrating a partial area of a semiconductor device according to an embodiment.

Referring to FIG. 2, a semiconductor device 100 according to an embodiment may include a first transistor 110, a second transistor 120, a diode transistor 130, and the like. The first transistor 110 and the second transistor 120 may be semiconductor elements included in a circuit to be implemented in the semiconductor device 100, and the diode transistor 130 may be a semiconductor element provided for the purpose of preventing or reducing damage to the first transistor 110 and the second transistor 120 in a manufacturing process of the semiconductor device 100. The diode transistor 130 may be disposed between the first transistor 110 and the second transistor 120.

The first transistor 110, the second transistor 120 and the diode transistor 130 may be disposed between a first dummy gate structure 141 and a second dummy gate structure 142. However, the first dummy gate structure 141 and the second dummy gate structure 142 may be omitted, or a larger number of transistors may be formed between the first dummy gate structure 141 and the second dummy gate structure 142, according to embodiments.

The first transistor 110 may include active areas 111 and 112 and a gate structure 113. The active areas 111 and 112 may provide a source area 111 and a drain area 112 of the first transistor 110. The gate structure 113 may be formed to cross the active areas 111 and 112, and may be formed to protrude from an upper surface of the semiconductor substrate on which the semiconductor device 100 is formed. Each of the source area 111 and the drain area 112 may be connected to metal lines 116 and 117 through contacts 114 and 115, respectively. It can be understood that the gate structure 113 may also be connected to the metal lines 116 and 117 through a contact 118, and a metal line connected to the gate structure 113 in FIG. 2 is omitted.

The first transistor 110 and the second transistor 120 may have a similar structure. The second transistor 120 may include a source area 121, a drain area 122 and a gate structure 123, and the source area 121 and the drain area 122 may be connected to metal lines 126 and 127 through contacts 124 and 125, respectively. The gate structure 123 may also be connected to the metal lines 126 and 127 through a contact 128.

The diode transistor 130 may include a first active area 131 and a second active area 132, and a diode gate structure 133. The first active area 131 and the second active area 132 may be doped with a same conductivity type impurity as that of the source areas 111 and 121 and the drain areas 112 and 122. The first active area 131 may be formed between the first transistor 110 and the diode gate structure 133, and the second active area 132 may be formed between the second transistor 120 and the diode gate structure 133. The first active area 131 may be connected to a first metal line 136 through a first contact 134, and the first metal line 136 may be connected to the gate structure 113 of the first transistor 110 through a contact 119. That is, the gate structure 113 of the first transistor 110 may be connected to a first antenna diode 181 provided by the first active area 131.

Similarly, the second active area 132 may be connected to a second metal line 137 through a second contact 135, and the second metal line 137 may be connected to the gate structure 123 of the second transistor 120 through a contact 129. Accordingly, the gate structure 123 of the second transistor 120 may be connected to a second antenna diode 182 provided by the second active area 132.

In an embodiment, the diode transistor 130 disposed between the first transistor 110 and the second transistor 120 in the first direction (X-axis direction) may provide the first antenna diode 181 connected to the first transistor 110, and the second antenna diode 182 connected to the second transistor 120. Accordingly, an additional semiconductor element, or an active area may not be formed in the second direction (Y-axis direction), and the degree of integration of the semiconductor device 100 may be prevented from being lowered in the second direction. In addition, as the diode gate structure 133 is disposed between the gate structure 113 of the first transistor 110 and the gate structure 123 of the second transistor 120, it is also possible to prevent the gate structures 113 and 123 from collapsing according to a subsequent process such as a polishing process, or the like.

The diode gate structure 133 may extend in a second direction and may be connected to a guard active area 150 by a guard contact 151. The guard active area 150 may be an area doped with a same conductivity type impurity same as that of the active areas 111, 112, 121 and 122, and may receive a predetermined voltage. For example, when the first transistor 110 and the second transistor 120 are NMOS transistors, the guard active area 150 may be doped with an N-type impurity. On the other hand, when the first transistor 110 and the second transistor 120 are PMOS transistors, the guard active area 150 may be doped with a P-type impurity.

When the first and second transistors 110 and 120 are NMOS transistors, the guard active area 150 may receive a ground voltage as a bias voltage. Accordingly, the diode gate structure 133 may receive the ground voltage, and the first active area 131 and the second active area 132 may be separated by maintaining the diode transistor 130 in a turned-off state. When the first and second transistors 110 and 120 are PMOS transistors, the guard active area 150 may receive a voltage higher than the ground voltage as the bias voltage, and the first active area 131 and the second active area 132 may also be separated by maintaining the diode transistor 130 in a turned-off state.

The bias voltage input to the guard active area 150 may be input through the guard contact 151, or may input by a separate contact from the guard contact 151. The guard contact 151 may be a contact extending to a height below the metal lines 116, 117, 126, 127, 136 and 137.

Figure 3:
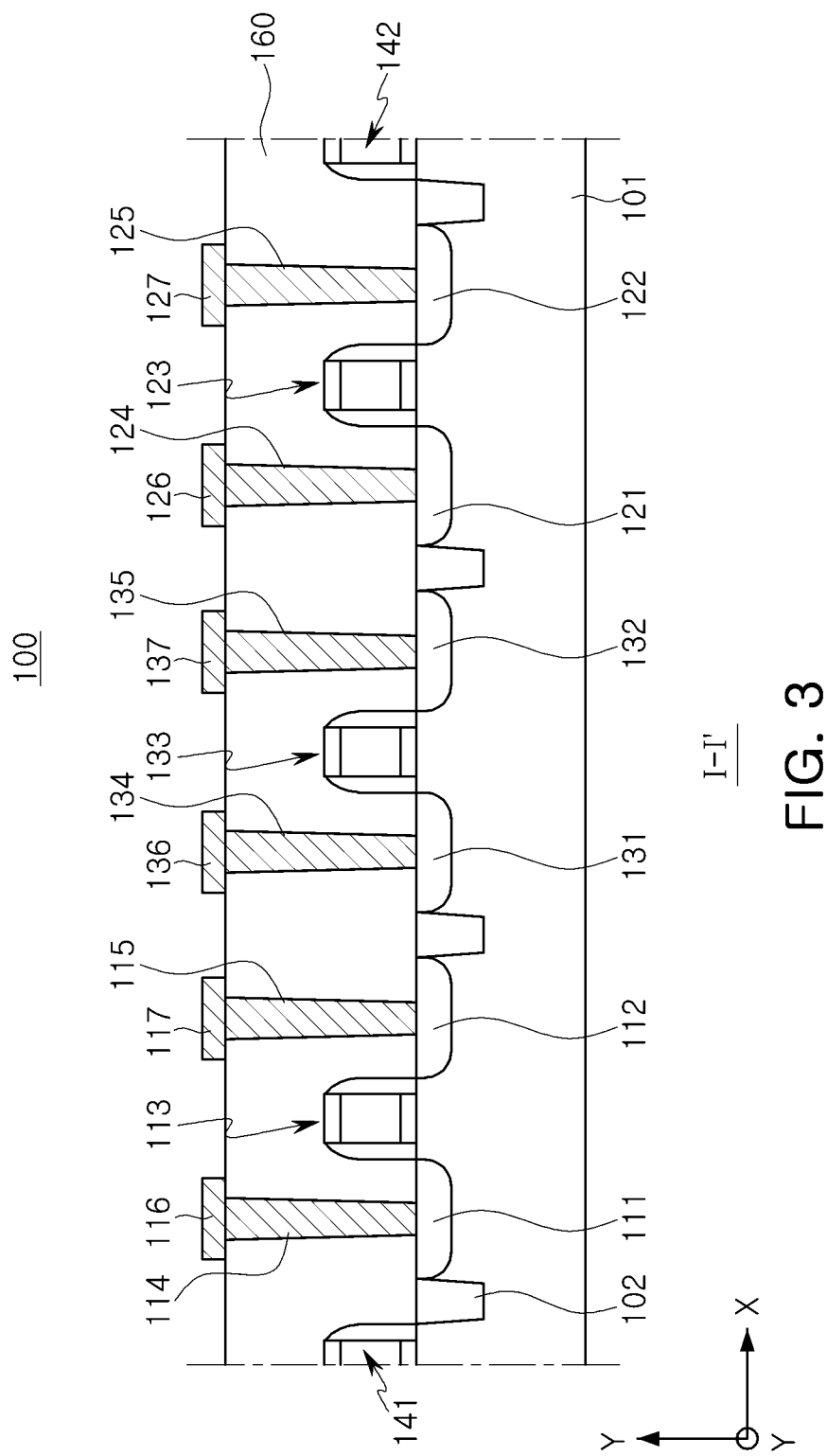
FIG. 3 is a cross-sectional view taken along line I-I' of the semiconductor device according to an example embodiment illustrated in FIG. 2.
Figure 4:
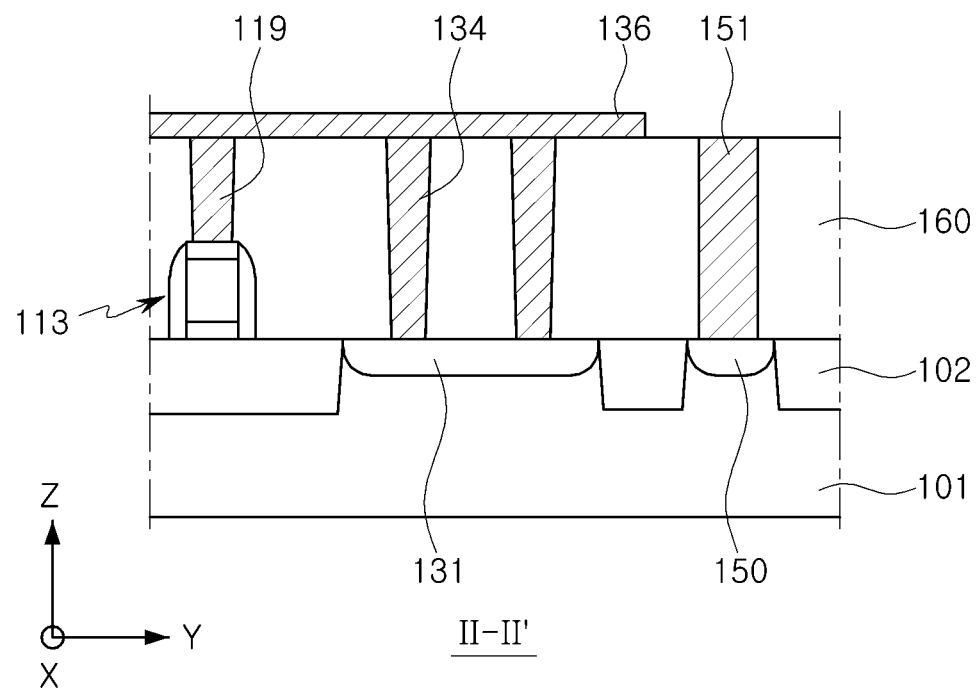
FIG. 4 is a cross-sectional view taken along line II-II' of the semiconductor device according to an example embodiment illustrated in FIG. 2.
Figure 5:
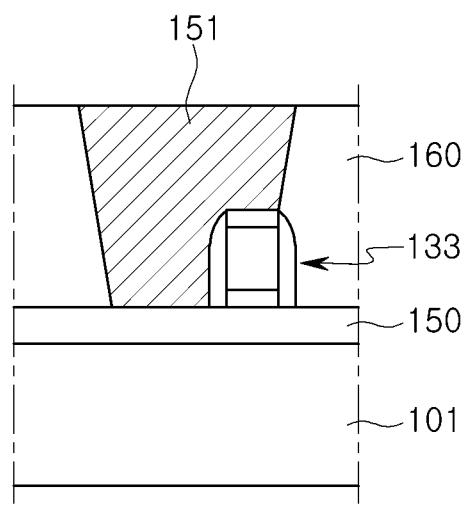
FIG. 5 is a cross-sectional view taken along line of the semiconductor device according to an example embodiment illustrated in FIG. 2.

FIG. 3 is a cross-sectional view taken along line I-I' of the semiconductor device according to an embodiment illustrated in FIG. 2. FIG. 4 is a cross-sectional view taken along line II-II' of the semiconductor device according to an embodiment illustrated in FIG. 2, and FIG. 5 is a cross-sectional view taken along line III-III' of the semiconductor device according to an embodiment illustrated in FIG. 2.

First, referring to FIG. 3, in an embodiment, the diode transistor 130 may be disposed between the first transistor 110 and the second transistor 120. An element isolation area 102 may be formed at a boundary of the first transistor 110 and the second transistor 120, and the diode transistor 130, respectively. The element isolation area 102 may be formed by shallow trench isolation (STI), deep trench isolation (DTI), or the like.

First and second dummy gate structures 141 and 142 formed near the first transistor 110 and the second transistor 120 may be formed immediately adjacent to the element isolation area 102. The first and second dummy gate structures 141 and 142 may be formed to cross or to be adjacent to active areas.

Next, referring to FIG. 4, the first active area 131 of the diode transistor 130 may be connected to the first metal line 136 through a plurality of first contacts 134. The first metal line 136 may extend to an upper portion of the gate structure 113 of the first transistor 110 in the second direction (Y-axis direction). The gate structure 113 of the first transistor 110 may be connected to the first active area 131 through the contact 119 and the first metal line 136. Accordingly, when charges or currents, generated by discharge in a subsequent manufacturing process using plasma, or the like, are generated, the charges or currents may flow to the first antenna diode 181 provided by the first active area 131, so that damage to the gate structure 113 may be significantly reduced.

A guard active area 150 may be located between the element isolation areas 102, and may be doped with an impurity of a same conductivity type as that of the first active area 131. Referring to FIG. 5, the guard active area 150 may be connected to the diode gate structure 133 by a guard contact 151, and the guard contact 151 may extend to a lower portion of the first metal line 136.

Figure 6:
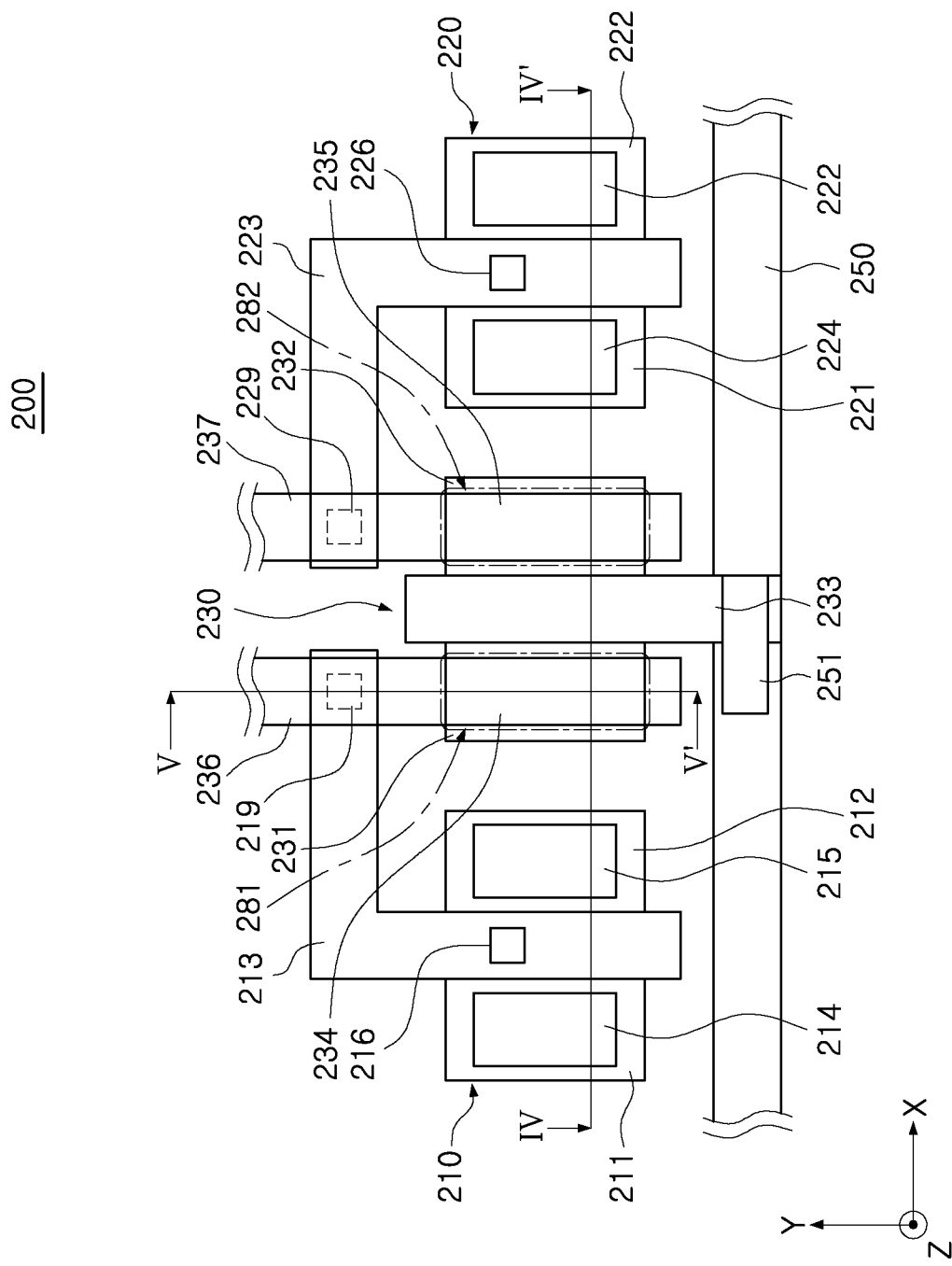
FIG. 6 is a plan view illustrating a partial area of a semiconductor device according to an example embodiment.

FIG. 6 is a plan view illustrating a partial area of a semiconductor device according to an embodiment.

A semiconductor device 200 according to an embodiment illustrated in FIG. 6 may include a first transistor 210 and a second transistor 220, having a channel area provided by a fin structure, a diode transistor 230, and the like. In an embodiment illustrated in FIG. 6, a portion of components may be omitted to explain a structure of the semiconductor device 200. For example, an interlayer insulating layer formed on a semiconductor substrate is not illustrated in FIG. 6.

The first transistor 210 may include a source area 211 and a drain area 212, a gate structure 213, and the like. The source area 211 and the drain area 212 may be connected to a fin structure embedded in the gate structure 213. Each of the source area 211 and the drain area 212 may be connected to contacts 214 and 215, which may be formed to recess at least portions of the source area 211 and the drain area 212, respectively. The gate structure 213 may be connected to a contact 216, which may have a lower height than the contacts 214 and 215 connected to the source area 211 and the drain area 212. The height may be a length defined in a third direction (Z-axis direction). A second transistor 220 may have a structure similar to that of the first transistor 210.

The diode transistor 230 may be disposed between the first transistor 210 and the second transistor 220, and may include a first active area 231 and a second active area 232, a diode gate structure 233, and the like. The first active area 231 may be connected to a first metal line 236 through a first contact 234, and a second active area 232 may be connected to a second metal line 237 through a second contact 235. The first contact 234 and the second contact 234 may be formed to recess at least portions of the active area 231 and the second active area 232, respectively.

The first metal line 236 may extend in a second direction (Y-axis direction) and may be connected to the gate structure 213 of the first transistor 210 through a contact 219. Meanwhile, the second metal line 237 may extend in a second direction and may be connected to the gate structure 223 of the second transistor 220 through a contact 229. Therefore, the first active area 231 may provide a first antenna diode 281 connected to the gate structure 213 of the first transistor 210, and the second active area 232 may provide a second antenna diode 282 connected to the gate structure 223 of the second transistor 220.

The diode gate structure 233 may be connected to a guard active area 250 by a guard contact 251. The guard active area 250 may be an area doped with a same conductivity type impurity as that of the active areas 211, 212, 221, 222, 231 and 232, and may receive a predetermined bias voltage. By connecting the diode gate structure 233 to the guard active area 250, the diode transistor 230 may maintain a turned-off state. Thus, interference between the first antenna diode 281 and the second antenna diode 282 may be significantly reduced.

Figure 7:
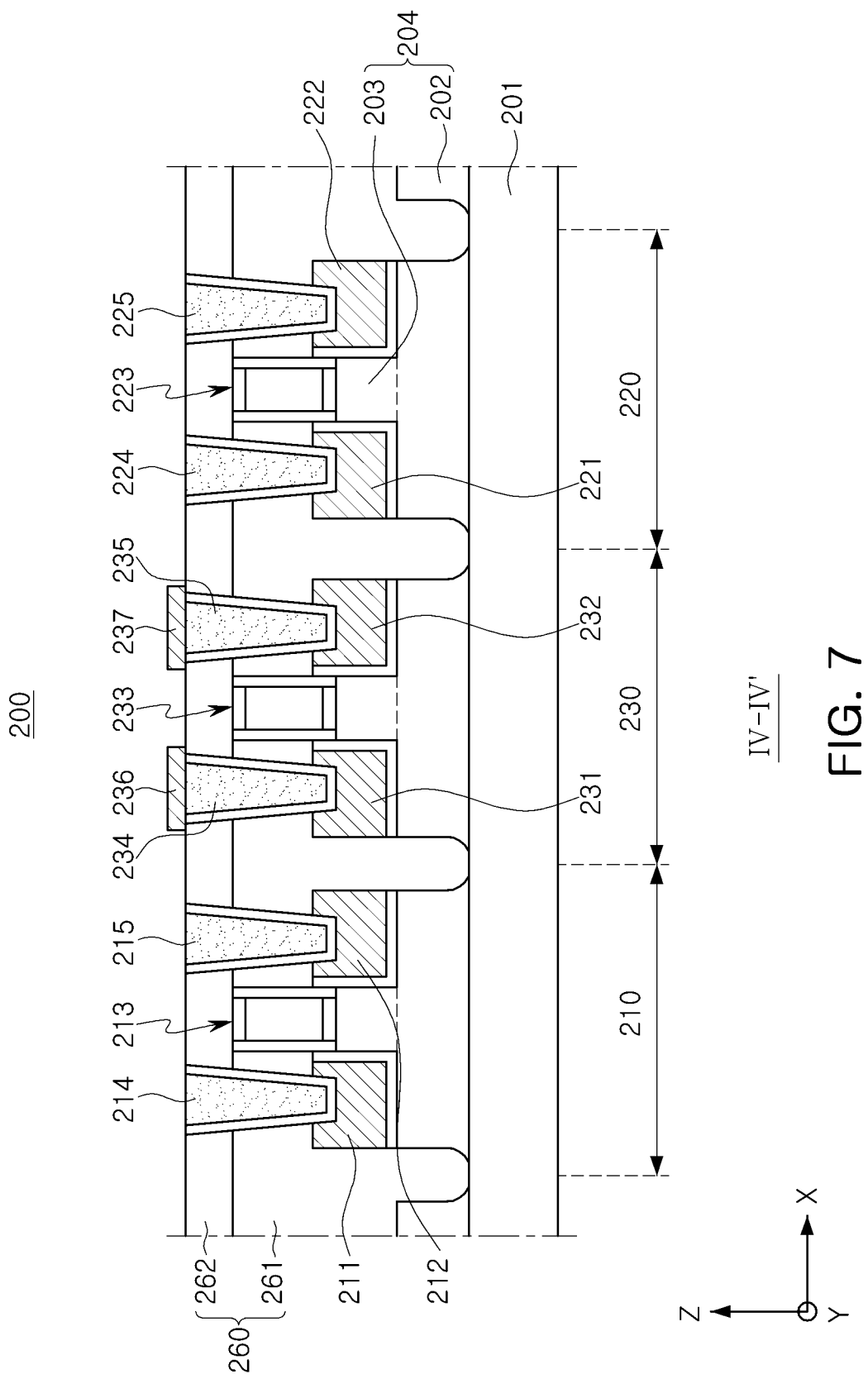
FIG. 7 is a cross-sectional view taken along line IV-IV' of the semiconductor device according to an example embodiment illustrated in FIG. 6.
Figure 8:
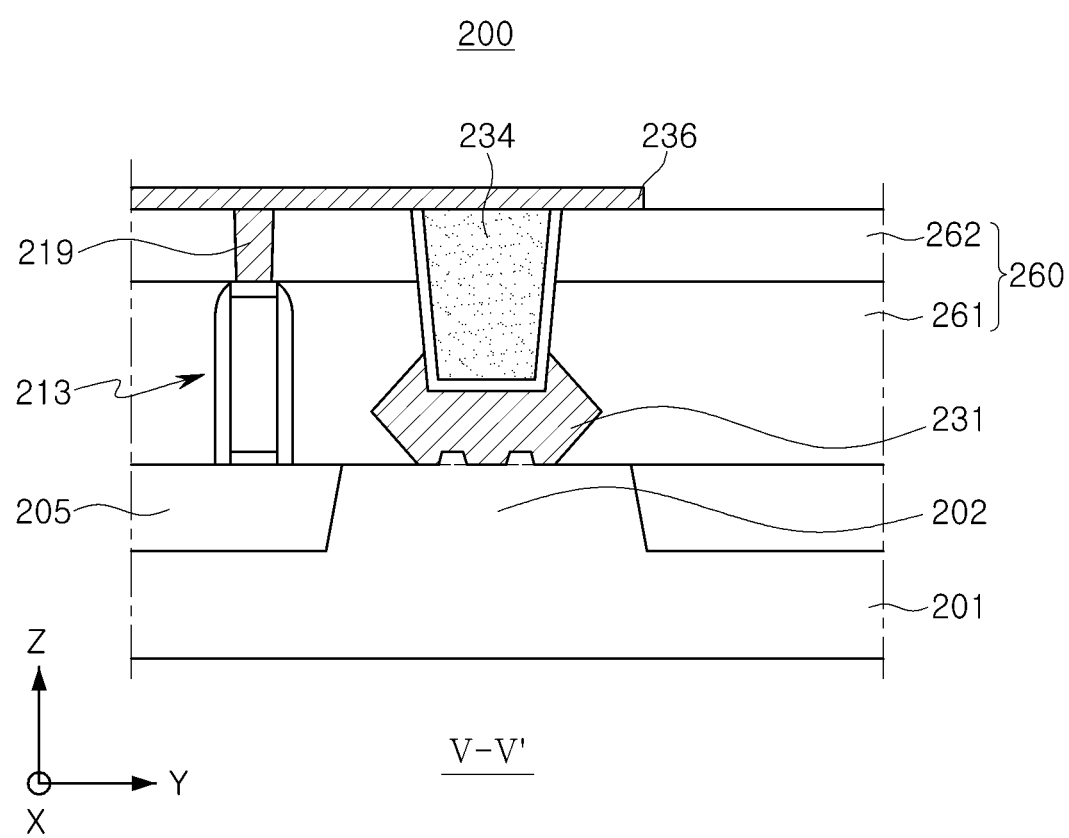
FIG. 8 is a cross-sectional view taken along line V-V' of the semiconductor device according to an example embodiment illustrated in FIG. 6.

FIG. 7 is a cross-sectional view taken along line IV-IV' of the semiconductor device according to an embodiment illustrated in FIG. 6, and FIG. 8 is a cross-sectional view taken along line V-V' of the semiconductor device according to an embodiment illustrated in FIG. 6.

First, referring to FIG. 7, a semiconductor device 200 according to an embodiment may include the first transistor 210, the second transistor 220, and the diode transistor 230 having a channel area provided by a fin structure 204. The fin structure 204 may be a structure erected in a third direction (Z-axis direction) perpendicular to an upper surface of a substrate 201, and may extend in a first direction (X-axis direction). The fin structure 204 may include lower fins 202 and upper fins 203, and the upper fins 203 may be covered by gate structures 213, 223 and 233.

The lower fins 202 may provide a seed layer necessary for the active areas 211, 212, 221, 222, 231 and 232 to be formed by a selective epitaxial growth (SEG) process. That is, the lower fins 202 may be connected to the active areas 211, 212, 221, 222, 231 and 232. In addition, the lower fins 202 may be removed between the first and second transistors 210 and 220 and the diode transistor 230.

As described above, the contacts 214, 215, 224, 225, 234 and 235 connected to the active areas 211, 212, 221, 222, 231 and 232, respectively, may be formed to recess portions of active areas 211, 212, 221, 222, 231 and 232, respectively.

The contacts 214, 215, 224, 225, 234 and 235 may include a barrier metal layer, a fill metal layer filling an inside of the barrier metal layer, and the like, and the barrier metal layer and the fill metal layer may be formed of different conductive materials.

The active areas 211, 212, 221, 222, 231, and 232 and the gate structures 213, 223, and 233 may be covered by an interlayer insulating layer 260. The interlayer insulating layer 260 may include a first interlayer insulating layer 261 and a second interlayer insulating layer 262 which may be formed on an upper surface of the first interlayer insulating layer 261. The contacts 214, 215, 224, 225, 234 and 235 may be embedded in the interlayer insulating layer 260, and upper surfaces of the contacts 214, 215, 224, 225, 234 and 235 may be coplanar with an upper surface of the second interlayer insulating layer 262. Accordingly, the first metal line 236 and the second metal line 237 may be connected to the first contact 234 and the second contact 235, respectively, on the upper surface of the second interlayer insulating layer 262.

Referring to FIG. 8, the first active area 231 of the diode transistor 230 may be connected to the first metal line 236 above the interlayer insulating layer 260 through the first contact 234. The first active area 231 may be grown from the lower fin 202, and an element isolation film 205 may be formed between the lower fins 202. The first metal line 236 may extend in a second direction (Y-axis direction) and may be connected to a gate structure 213 of the first transistor 210 through a contact 219. Accordingly, the gate structure 213 of the first transistor 210 may be connected to a first antenna diode 281 provided by the first active area 231, and currents due to discharge generated in a subsequent manufacturing process using plasma, or the like may flow to a semiconductor substrate 201 through the first antenna diode 281.

Figure 9:
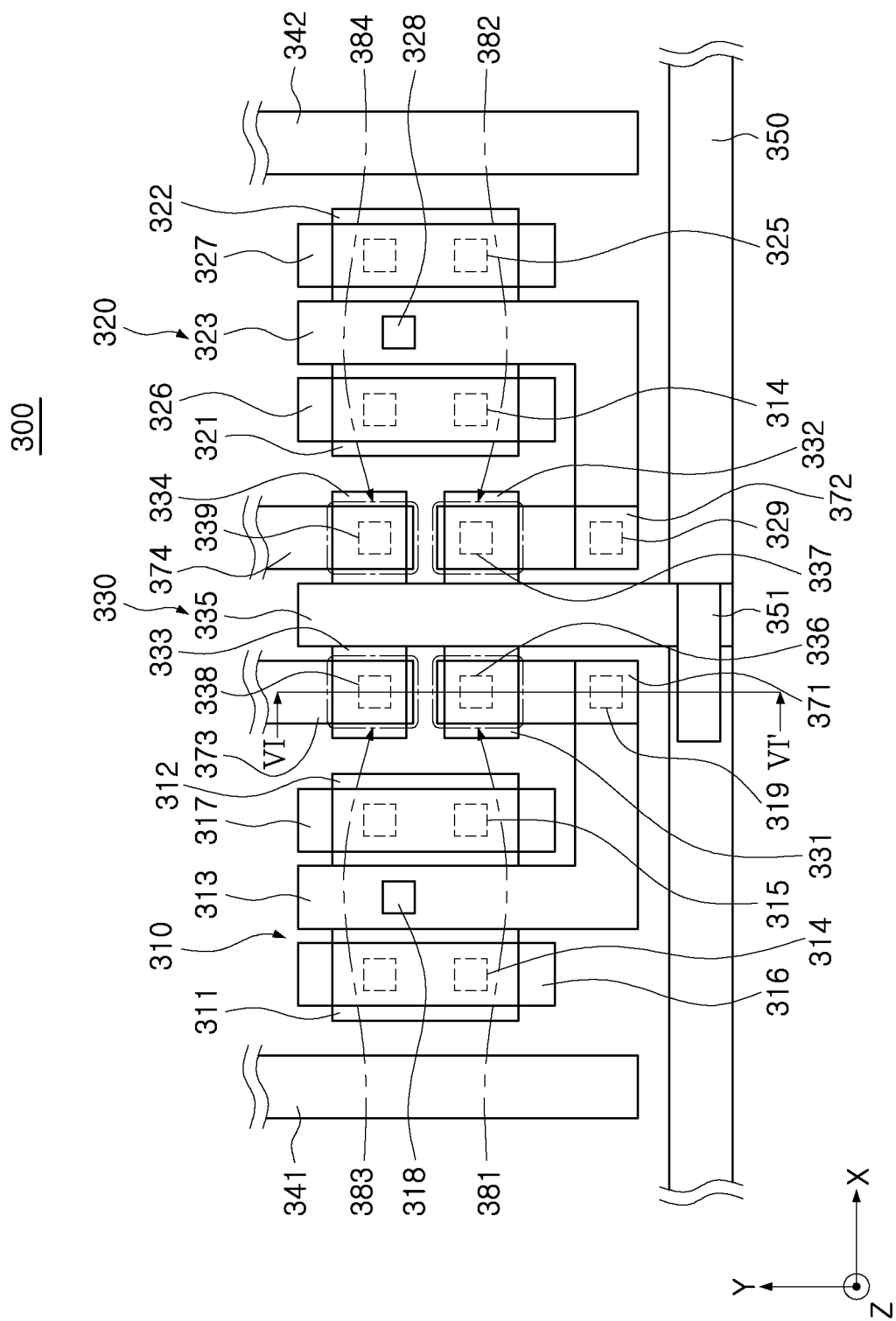
FIG. 9 is a plan view illustrating a partial area of a semiconductor device according to an example embodiment.

FIG. 9 is a plan view illustrating a partial area of a semiconductor device according to an embodiment.

In an embodiment illustrated in FIG. 9, a semiconductor device 300 may include first and second transistors 310 and 320, a diode transistor 330, dummy gate structures 341 and 342, and the like. The diode transistor 330 may be disposed between the first transistor 310 and the second transistor 320, and may provide a plurality of antenna diodes 381 to 384. The first transistor 310 and the second transistor 320 may have structures similar to those of the first transistor 110 and the second transistor 120 describe above with reference to FIGS. 2 to 5.

In an embodiment illustrated in FIG. 9, the diode transistor 330 may include first to fourth active areas 331 to 334. The first active area 331 and the third active area 333 may be disposed adjacent to the first transistor 310, and the second active area 332 and the fourth active area 334 may be disposed adjacent to the second transistor 320. The first active area 331 may provide a first antenna diode 381 connected to the gate structure 313 of the first transistor 310, and the second active area 332 may provide a second antenna diode 382 connected to the gate structure 323 of the second transistor 320. A size of each of the first to fourth active areas 331 to 334 is smaller than a size of each of a source area 311, a drain area 312, a source area 321 and a drain area 322 of the first transistor 310 and the second transistor 320.

The first active area 331 may be connected to a first metal line 371 through a first contact 336, and the first metal line 371 may be connected to the gate structure 313 of the first transistor 310 through a contact 319. Similarly, the second active area 332 may be connected to a second metal line 371 through a second contact 337, and the second metal line 372 may be connected to the gate structure 323 of the second transistor 320 by a contact 329.

On the other hand, a third active area 333 and a fourth active area 334 may be separated from the first metal line 371 and the second metal line 372. Referring to FIG. 9, the third active area 333 may be connected to a third metal line 373 through a third contact 338, and the fourth active area 334 may be connected to a fourth metal line 374 through a fourth contact 339. Accordingly, in an embodiment illustrated in FIG. 9, the diode transistor 330 may provide first to fourth antenna diodes 381 to 384 by the first to fourth active areas 331 to 334. The third metal line 373 and the fourth metal line 374 may be connected to transistors other than the first transistor 310 and the second transistor 320 to provide a third antenna diode 383 and a fourth antenna diode 384.

A diode gate structure 335 may be formed to be adjacent to the first to fourth active areas 331 to 334. The diode gate structure 335 may extend to a guard active area 350 in a second direction (Y-axis direction), and may be connected to the guard active area 350 by a guard contact 351. The guard active area 350 may be doped with a same conductivity type impurity as that of the first to fourth active areas 331 to 334, and may receive a predetermined bias voltage. The diode transistor 330 may maintain a turned-off state by a bias voltage input to the guard active area 350. Accordingly, the first active area 331 and the second active area 332 may be electrically separated from each other, and the third active area 333 and the fourth active area 334 may be electrically separated from each other, such that the diode transistor 330 may provide the first to fourth antenna diodes 381 to 384. Since four antenna diodes connected to four different transistors are provided by one diode transistor 330, the degree of integration of the semiconductor device 300 may be improved.

On the other hand, in an embodiment illustrated in FIG. 9, the first active area 331 and the second active area 332 may be disposed closer to the guard active area 350 than the third active area 333 and the fourth active area 334. Accordingly, a portion of areas extending from the gate structures 313 and 323 of the first transistor 310 and the second transistor 320 to a first direction (X-axis direction) may be disposed between the diode transistor 330 and the guard active area 350.

Figure 10:
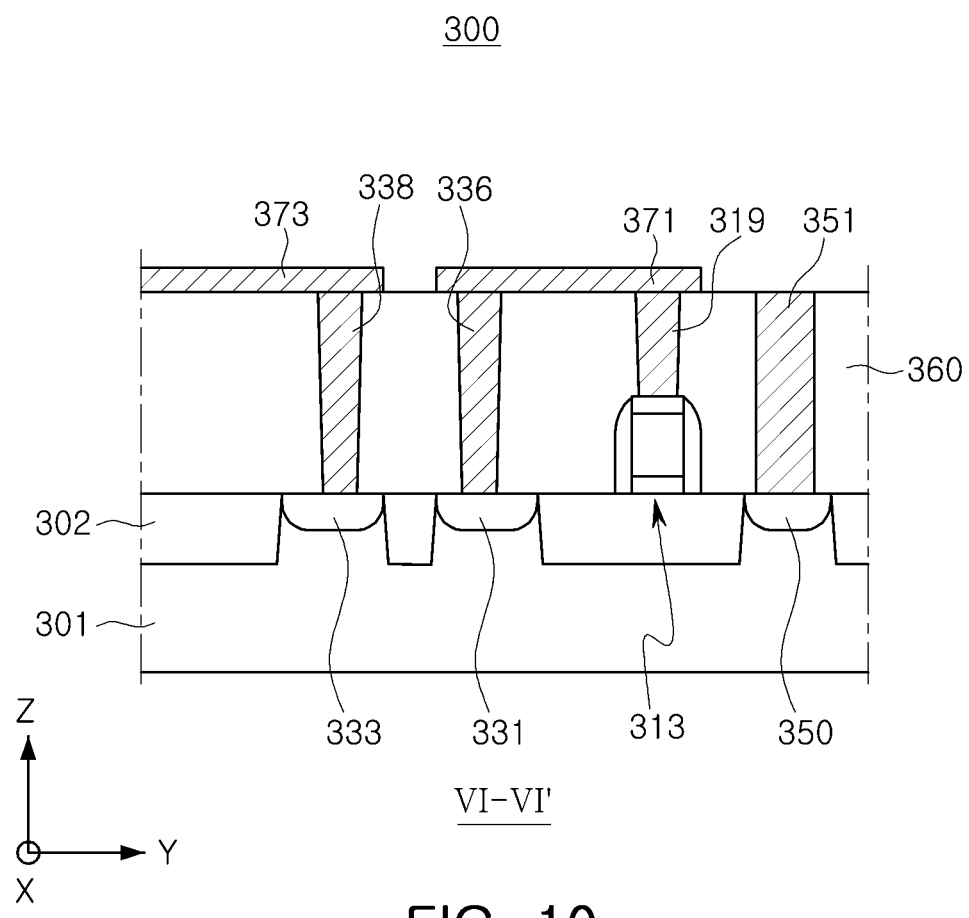
FIG. 10 is a cross-sectional view taken along line VI-VI' of the semiconductor device according to an example embodiment illustrated in FIG. 9.

FIG. 10 is a cross-sectional view taken along line VI-VI' of the semiconductor device according to an embodiment illustrated in FIG. 9.

Referring to FIG. 10, an element isolation area 302 may be formed in a semiconductor substrate 301. The element isolation area 302 may be formed between the active areas 331 and 333 and the guard active area 350. The first active area 331 and the third active area 333 may be electrically separated from each other, disposed between the diode gate structure 335 and the first transistor 310, by the element isolation area 302.

As described above, the first active area 331 may provide the first antenna diode 381, the third active area 333 may provide the third antenna diode 383, and the first antenna diode 381 and the third antenna diode 383 may be connected to different transistors. Referring to FIG. 10, the first active area 331 may be connected to the gate structure 313 of the first transistor 310 through the first contact 336, the first metal line 371, and the like. On the other hand, the third active area 333 may be connected to the third metal line 373 through a third contact 338, and the third metal line 373 may be connected to a gate structure of a transistor other than the first transistor 310.

The guard active area 350 may be connected to the guard contact 351, and the guard contact 351 may connect the guard active area 350 and the diode gate structure 335. The guard contact may be formed to penetrate an interlayer insulating layer 360. That is, the upper surface of the guard contact 351 may be coplanar with an upper surface of the interlayer insulating layer 360 and lower surfaces of the metal lines 371 and 373.

Figure 11:
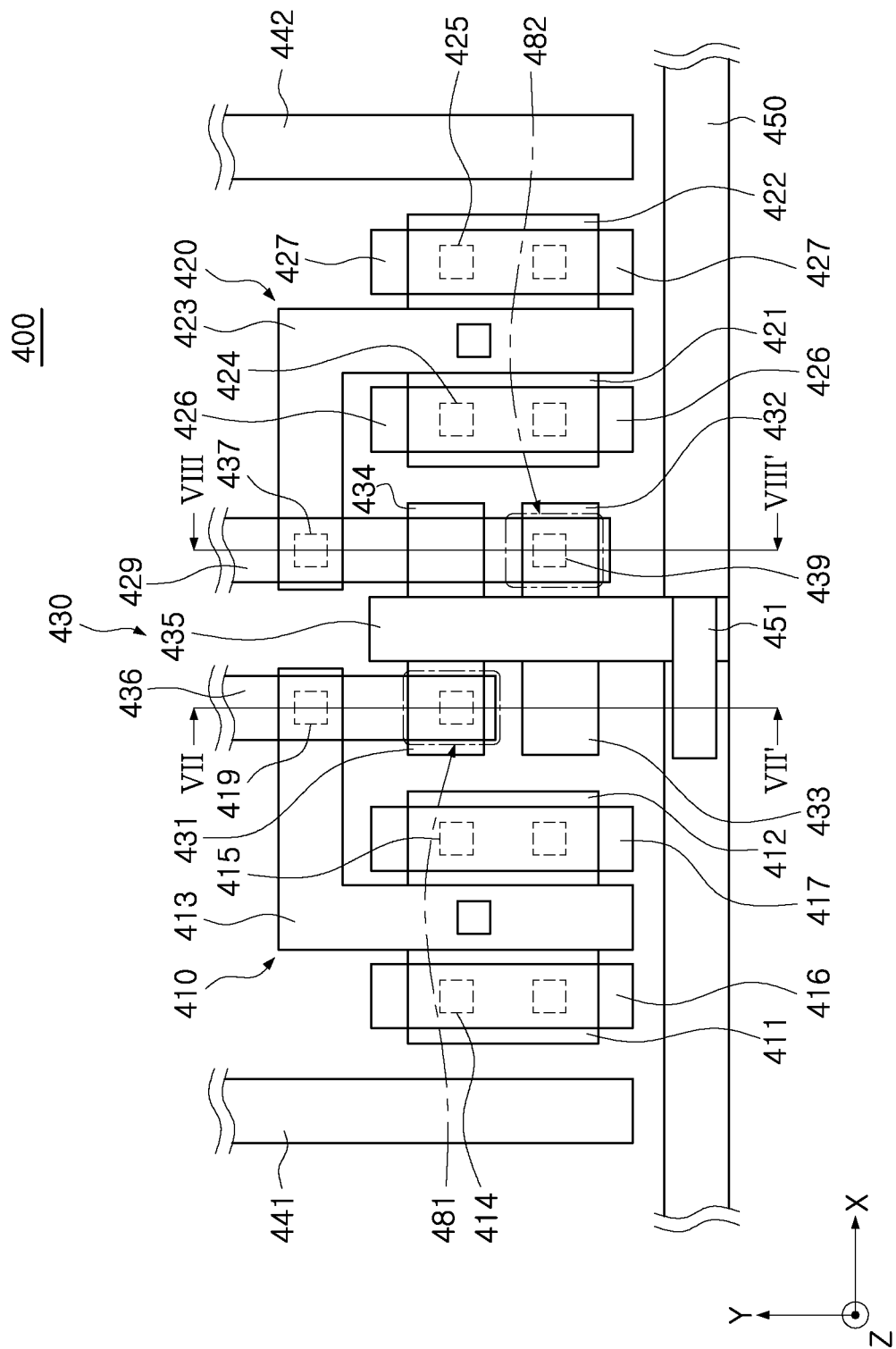
FIG. 11 is a plan view illustrating a partial area of a semiconductor device according to an example embodiment.

FIG. 11 is a plan view illustrating a partial area of a semiconductor device according to an embodiment.

In an embodiment illustrated in FIG. 11, a semiconductor device 400 may include a plurality of transistors 410 and 420, a diode transistor 430, dummy gate structures 441 and 442, and the like. The diode transistor 430 may be disposed between the first transistor 410 and the second transistor 420, and may provide a plurality of antenna diodes 481 and 482. The first transistor 410 and the second transistor 420 may have a similar structure to those of the first transistors 110 and 310 and the second transistors 120 and 320 described above with reference to FIGS. 2 to 5, 9, 10, and the like.

In an embodiment illustrated in FIG. 11, the diode transistor 430 may include first to fourth active areas 431 to 434. The first active area 431 and the third active area 433 may be disposed adjacent to the first transistor 410, and the second active area 432 and the fourth active area 434 may be disposed adjacent to the second transistor 520. The first active area 431 may provide a first antenna diode 481 connected to a gate structure 413 of the first transistor 410, and the second active area 432 may provide a second antenna diode 482 connected to a gate structure 423 of the second transistor 420.

Referring to FIG. 11, the first active area 431 and the second active area 432 may be disposed in different positions in the first direction (X-axis direction) and the second direction (Y-axis direction). In addition, the fourth active area 434 facing the first active area 431 and the third active area 433 facing the second active area 432 with respect to the diode gate structure 435 may be floated without being connected to metal lines 436 and 437.

The diode gate structure 435 may extend to a guard active area 450 and may receive a predetermined bias voltage by a guard contact 451 so that the diode transistor 430 may maintain the turned-off state by the bias voltage. However, a current may flow through a leakage path across the diode gate structure 435, despite maintaining the turned-off state. In FIG. 11, the first active area 431 and the second active area 432 are disposed in different positions in the first and second directions, so that a current flowing into the first antenna diode 481 may be prevented from flowing to the second antenna diode 482 along the leakage path. Therefore, interference between the first antenna diode 481 and the second antenna diode 482 may be reduced.

Figure 12:
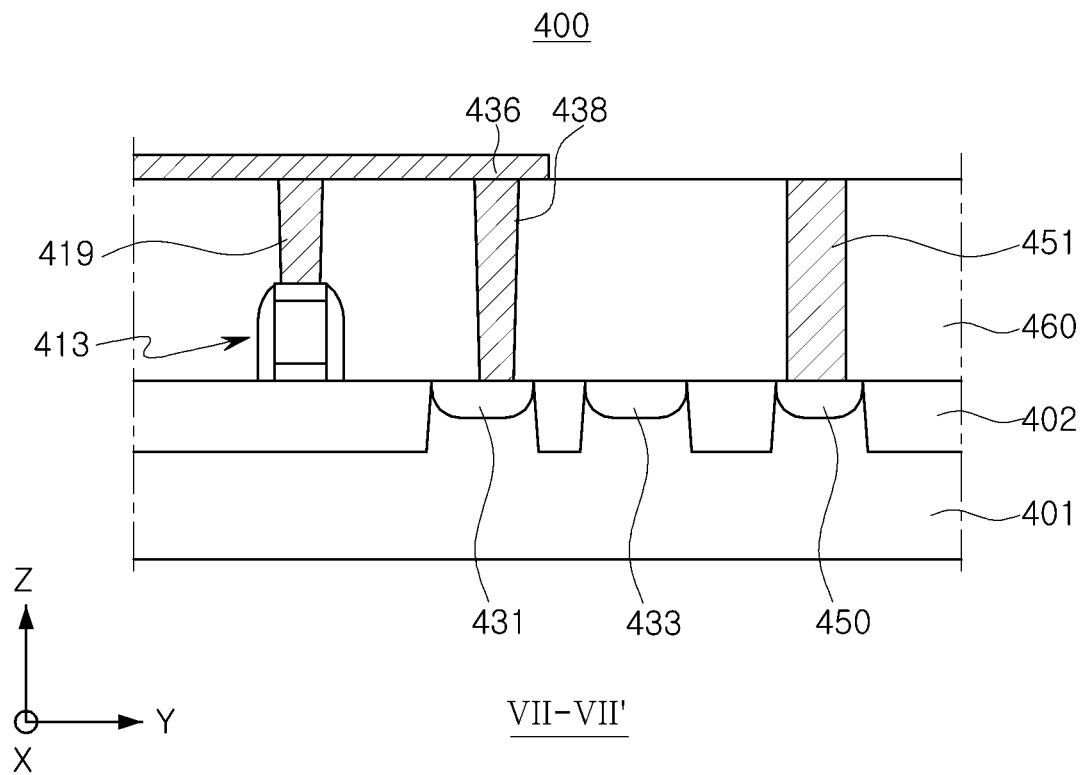
FIG. 12 is a cross-sectional view taken along line VII-VII' of the semiconductor device according to an example embodiment illustrated in FIG. 11.
Figure 13:
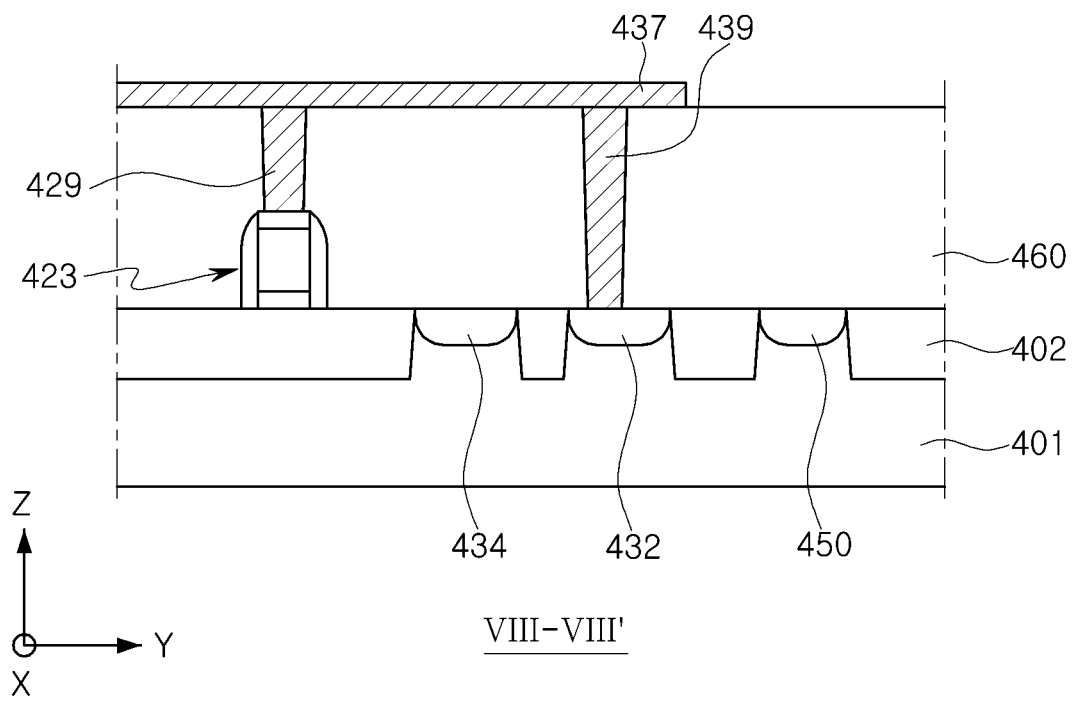
FIG. 13 is a cross-sectional view taken along line VIII-VIII' of the semiconductor device according to an example embodiment illustrated in FIG. 11.

FIG. 12 is a cross-sectional view taken along line VII-VII' of the semiconductor device illustrate in FIG. 11, and FIG. 13 is a cross-sectional view taken along line VIII-VIII' of the semiconductor device according to an embodiment illustrated in FIG. 11.

First, referring to FIG. 12, an element isolation area 402 may be formed in a semiconductor substrate 401, and active areas 431 and 433 and a guard active area 450 may be formed between the element isolation area 402. The first active area 431 may be connected to a first metal line 436 through a first contact 438, and the first metal line 436 may be connected to the gate structure 413 of the first transistor 410 by a contact 419. Thus, the first active area 431 may provide the first antenna diode 481 for the first transistor 410.

On the other hand, the third active area 433 may be floated by not being connected to a metal line. That is, the third active area 433 may not provide an antenna diode connected to other transistors. Thus, even when the current flowing into the second antenna diode 482 provided by the second active area 432 flows into the third active area 433 through a leakage path below the diode gate structure 435, damage to the semiconductor may be prevented since no interference may occur between the different transistors.

The guard active area 450 may be connected to the guard contact 451, and the guard contact 451 may have a height penetrating an interlayer insulating layer 460. The upper surface of the guard contact 451 may coplanar with the upper surface of the interlayer insulating layer 460 and the lower surface of the first metal line 436.

Next, referring to FIG. 13, the second active area 432 may be connected to the second metal line 437 on the interlayer insulating layer 460 by a second contact 439, and the second metal line 437 may extend in the second direction (Y-axis direction) and may be connected to the gate structure 423 of the second transistor 420 through a contact 429. That is, the second active area 432 may provide the second antenna diode 482 connected to the gate structure 423 of the second transistor 420.

The fourth active area 434 disposed below the second metal line 437 may be floated without being connected to a metal line. Therefore, as illustrated in FIG. 13, only the interlayer insulating layer 460 may be disposed between the second metal line 437 and the fourth active area 434. When the current flowing into the first active area 431 providing the first antenna diode 481 flows through a leakage path below the diode gate structure 435 to the fourth active area 434, the fourth active area 434 is floated, so that other transistors may not be affected.

Figure 14:
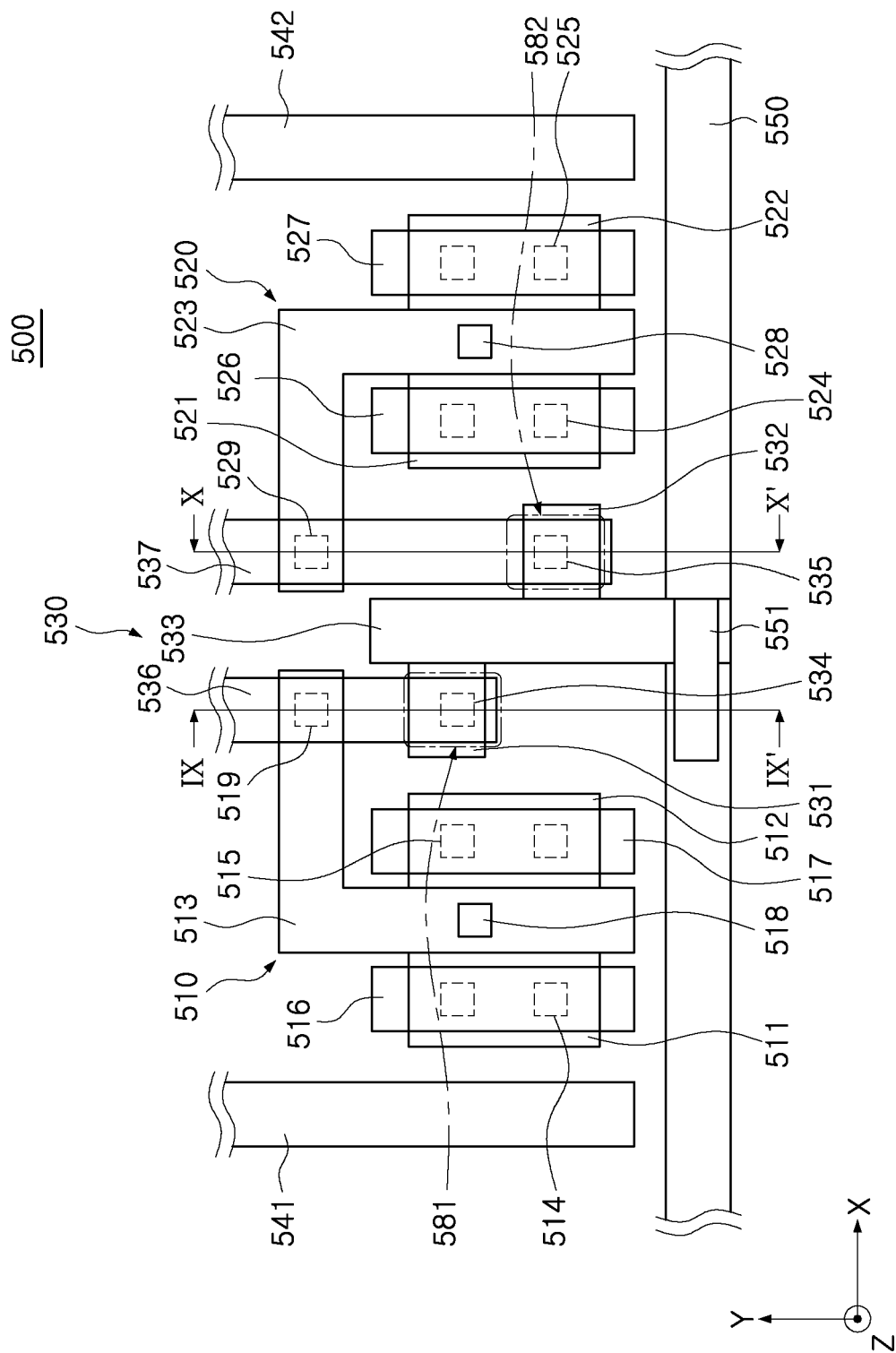
FIG. 14 is a plan view illustrating a partial area of a semiconductor device according to an example embodiment.

FIG. 14 is a plan view illustrating a partial area of a semiconductor device according to an embodiment.

In an embodiment illustrated in FIG. 14, a semiconductor device 500 may include a plurality of transistors 510 and 520, a diode transistor 530, dummy gate structures 541 and 542, and the like. The diode transistor 530 may be disposed between the first transistor 510 and the second transistor 520, and may provide a plurality of antenna diodes 581 to 582. The first transistor 510 and the second transistor 520 may have a structure similar to that of the first transistors 110, 310 and 410 and the second transistors 120, 320 and 420, described above with reference to FIGS. 2 to 5, FIGS. 9 to 12, and the like.

In an embodiment illustrated in FIG. 14, the diode transistor 530 may include first and second active areas 531 and 532. The first active area 531 and the second active area 532 may be disposed in different positions in the first direction (X-axis direction) and the second direction (Y-axis direction). Referring to FIG. 14, another active area may not be formed on the opposite side of each of the first active area 531 and the second active area 532, with respect to the diode gate structure 533.

In a semiconductor manufacturing process using plasma, or the like, when a current due to a discharge flows into a gate structure 513 of a first transistor 510, the current may pass through the first active area 531 to the semiconductor substrate 501. In an embodiment illustrated in FIG. 14, the first active area 531 and the second active area 532 may be disposed in a diagonal direction such that the leakage path below the diode gate structure 533 may be elongated. Therefore, even when the current flows to the leakage path, it may not be transmitted to the second active area 532, and interference between a first antenna diode 581 and a second antenna diode 582 may be reduced so that damage generated by the transistors 510 and 520 may be effectively reduced.

The semiconductor device 500 may include a first metal line 536 connected to the first active area 531 through a first contact 534, and a second metal line 537 connected to the second active area 532 through a second contact 535. The first metal line 536 may extend to an upper portion of the first active area 531, and the second metal line 537 may extend to an upper portion of the second active area 532, so that the first metal line 536 and the second metal line 537 may have different lengths in the second direction (Y-axis direction).

Shapes of the gate structures 513 and 523 illustrated in FIG. 14 may be merely examples, and may be variously modified. The gate structures 513 and 523 may include areas extending in the first direction (X-axis direction) to be connected to the first metal line 536 and the second metal line 537, respectively, and the areas may be disposed between the diode transistor 530 and a guard active area 550, unlike the embodiment illustrated in FIG. 14. In this case, the first metal line 536 may be formed to be longer than the second metal line 537 in the second direction (Y-axis direction).

Figure 15:
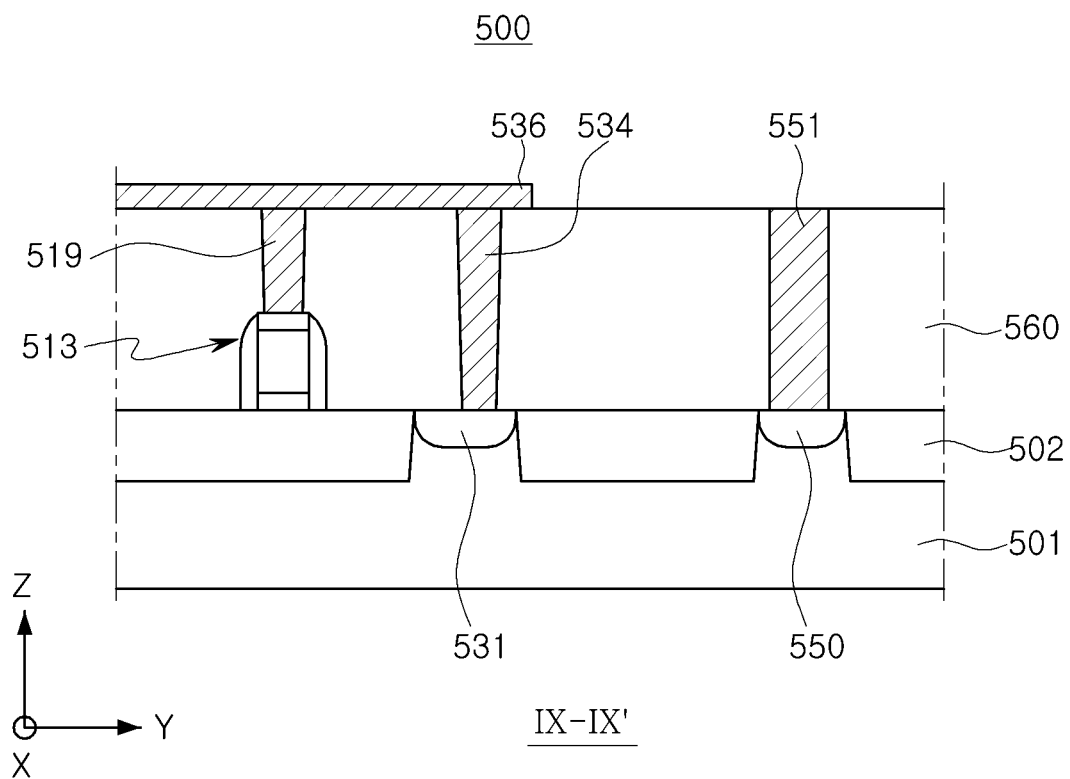
FIG. 15 is a cross-sectional view taken along line IX-IX' of the semiconductor device according to an example embodiment illustrated in FIG. 14.
Figure 16:
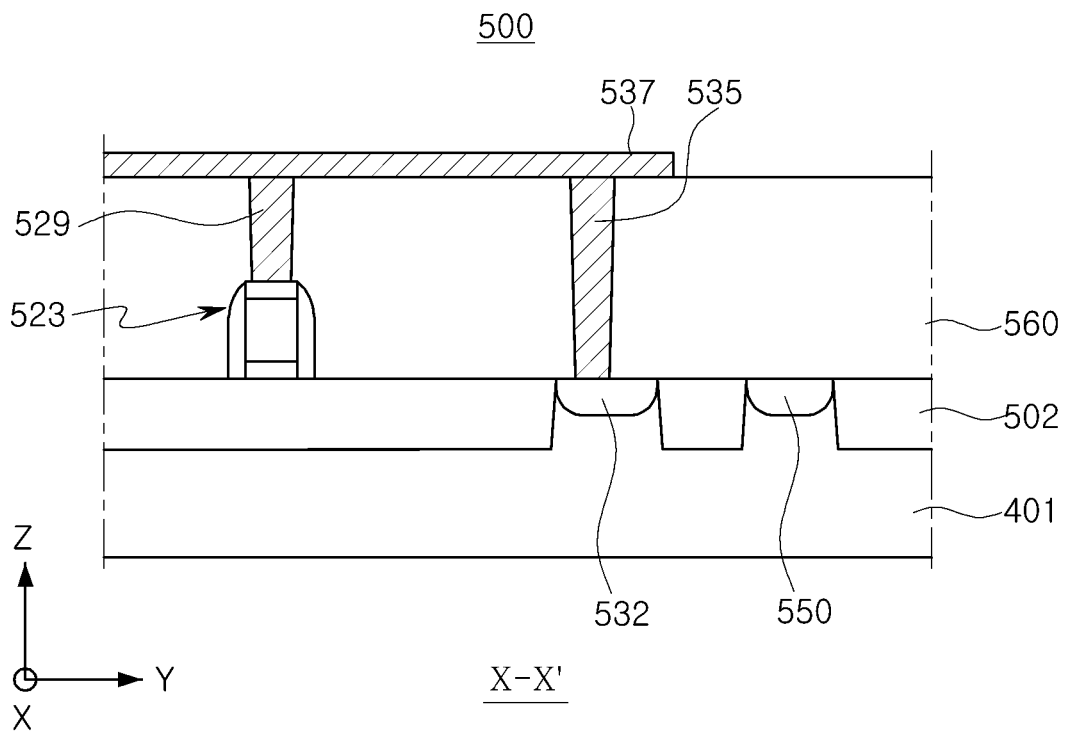
FIG. 16 is a cross-sectional view taken along line X-X' of the semiconductor device according to an example embodiment illustrated in FIG. 14.

FIG. 15 is a cross-sectional view taken along line IX-IX' of the semiconductor device illustrated in FIG. 14, and FIG. 16 is a cross-sectional view taken along line X-X' of the semiconductor device according to an embodiment illustrated in FIG. 14.

Referring to FIGS. 15 and 16, an element isolation area 502 may be formed in a semiconductor substrate 501, and the first active area 531 and a guard active area 550 may be formed between the element isolation areas 502. As described with reference to FIG. 14, the first active area 531 and the second active area 532 may be formed at different positions in the first direction (X-axis direction) and the second direction (Y-axis direction). Therefore, as illustrated in FIG. 15, only the element isolation area 502 may be formed between the first active area 531 and the guard active area 550. In addition, referring to FIG. 16, the element isolation area 502, in contact with the second active area 532 may extend to a lower portion of the gate structure 523 of the second transistor 520.

In an embodiment illustrated in FIGS. 14 to 16, the first active area 531 and the second active area 532 may be formed in a diagonal direction with respect to the diode gate structure 533, and all the other areas adjacent to the diode gate structure 533 may be filled with the element isolation area 502. That is, the distance between the first active area 531 and the second active area 532 may be increased. As a result, even when the current generated by the discharge in a semiconductor process flows into the first active area 531, the current may not be transmitted to the second active area 532 through a leakage path below the diode gate structure 533. Therefore, in applying the semiconductor process using plasma, the already formed transistors 510 and 520 may be more effectively protected.

The guard active area 550 may be connected to a guard contact 551, and the guard contact 551 may have a height penetrating an interlayer insulating layer 560. The upper surface of the guard contact 551 may be coplanar with an upper surface of the interlayer insulating layer 560 and a lower surface of the first metal line 536.

Figure 17:
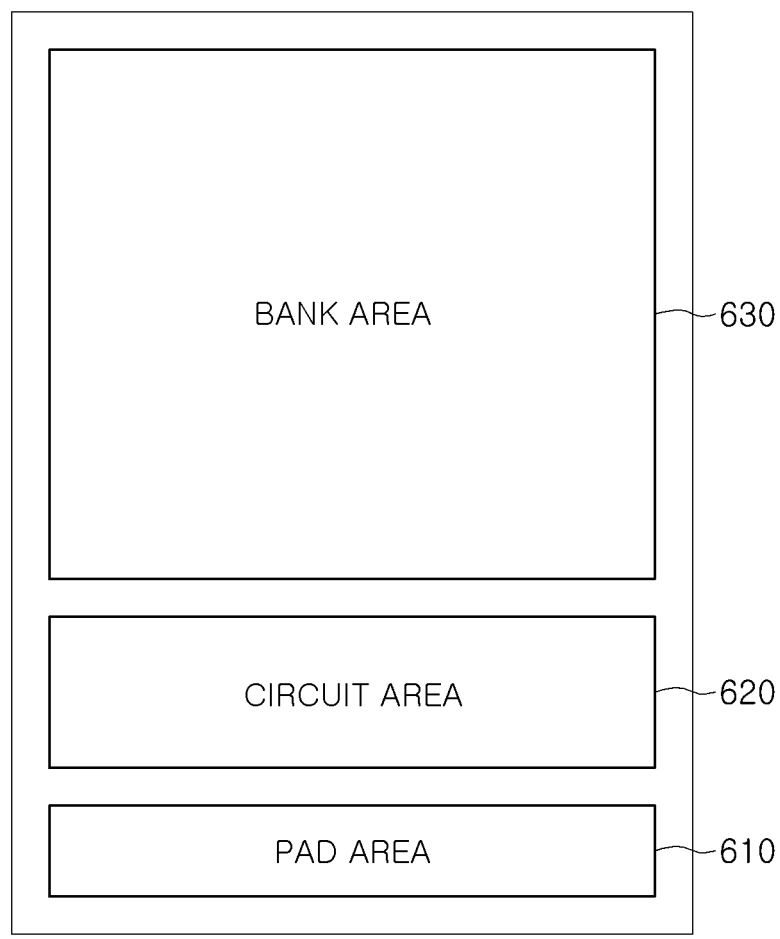
FIG. 17 is a simplified view of a memory device including a semiconductor device according to an example embodiment.

FIG. 17 is a simplified view illustrating a memory device including a semiconductor device according to an embodiment.

Referring to FIG. 17, a memory device 600 according to an embodiment may have a pad area 610, a circuit area 620 and a bank area 630. The pad area 610 may be an area in which a plurality of pads for inputting and outputting control signals, data, and the like, and the circuit area 820 may be an area in which various circuits necessary for the operation of the memory device 600 are formed. In the bank area 630, a plurality of banks having memory cells may be formed.

However, although it may be modified according to embodiments, circuits disposed in the circuit area 620 may be implemented by the semiconductor devices 100 to 500 according to the foregoing embodiments. That is, in the circuit area 629, an antenna diode may be provided for the purpose of preventing the transistors from being damaged in the manufacturing process of the memory device 600, and the antenna diode may be provided by the diode transistors 130 to 530 according to embodiments.

Figure 18:
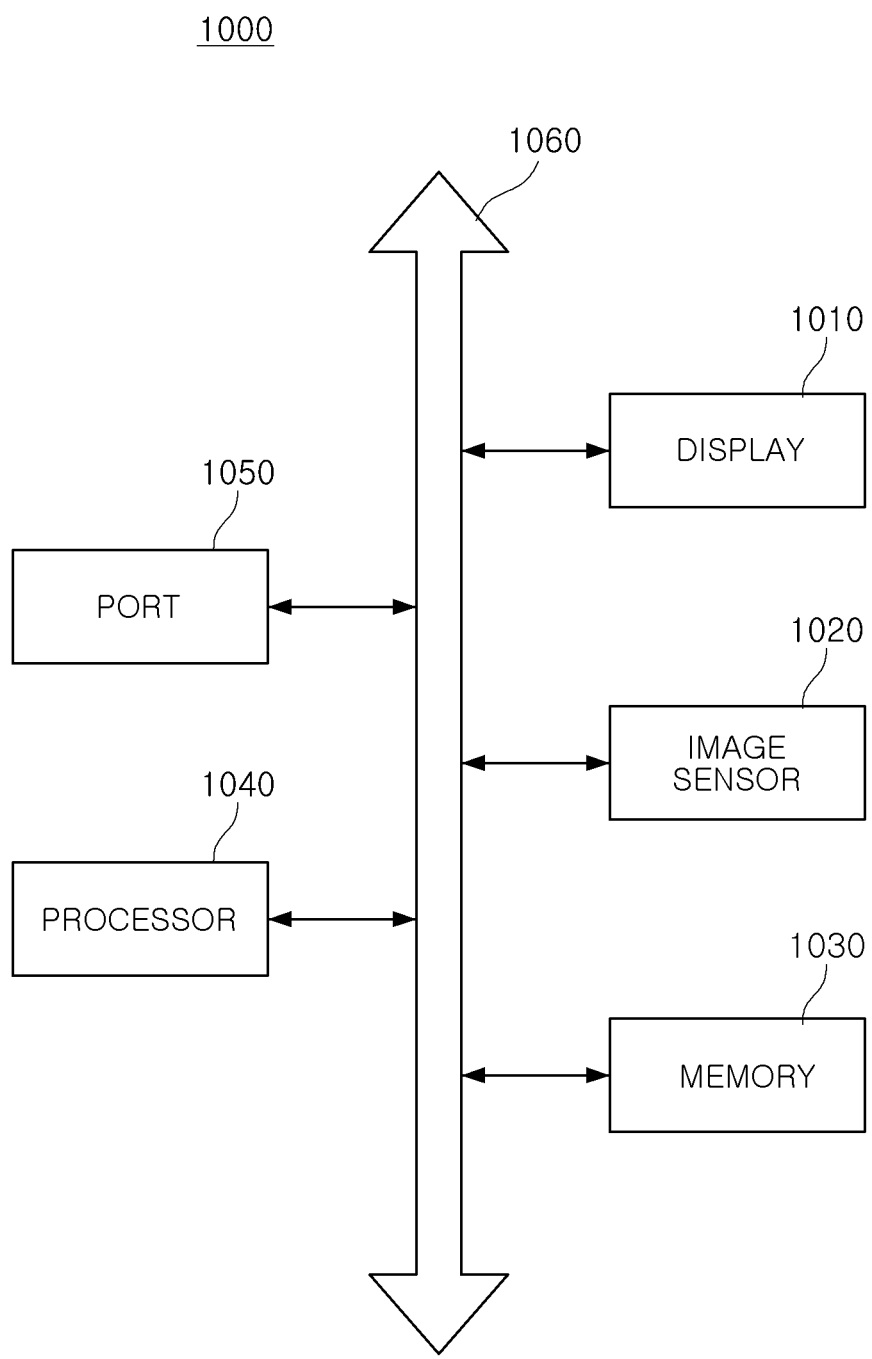
FIG. 18 is a block diagram illustrating an electronic device including a semiconductor device according to an example embodiment.

FIG. 18 is a block diagram illustrating an electronic device including a semiconductor device according to an embodiment.

An electronic device 1000 according to an embodiment illustrated in FIG. 18 may include a display 1010, an image sensor 1020, a memory 1030, a processor 1040, a port 1050, and the like. In addition, the electronic device 1000 may further include a wired/wireless communication device, a power supply device, and the like. Among the components illustrated in FIG. 18, the port 1050 may be a device in which the electronic device 1000 is provided for communicating with a video card, a sound card, a memory card, an USB card, and the like. The electronic device 1000 may be a concept including all smartphones, tablet PCs, smart wearable devices, and the like, as well as common desktop computers or laptop computers.

The processor 1040 may perform specific operations or commands, tasks, and the like. The processor 1050 may be a central processing unit CPU or a microprocessor unit MCU, a system on chip SoC, or the like, and the processor 1050 may communicate with the display 1010, the image sensor 1020, the memory device 1030, as well as other devices connected to the port 1050 via the bus 1060.

The memory 1030 may be a storage medium storing date necessary for the operation of the electronic device 1000, multimedia data, or the like. The memory 1030 may be a concept including a volatile memory such as a random access memory RAM, or a non-volatile memory such as a flash memory, or the like. In addition, the memory 1030 may include at least one of a solid state drive SSD, a hard disk drive HDD, and an optical disk drive ODD, as a storage device.

The semiconductor device according to the present inventive concept may be applied to the components including the transistors formed through the semiconductor process, such as the display 1010, the image sensor 1020, the memory 1030, the processor 1050, and the like. That is, to provide an antenna diode connected to the gate structure of the transistors, a diode transistor may be formed between the transistors, and the active areas of the diode transistor may be used as diodes. In addition, by connecting the gate structure to the guard active area to turn-off the diode transistor, interference between the active areas of the diode transistor may be significantly reduced.

As set forth above, a diode element for eliminating or significantly reducing damages which may occur in a semiconductor element in a process using plasma may be formed in a transistor form. Therefore, a gate electrode may be efficiently disposed at a predetermined interval such that a large number of semiconductor elements may be integrated in a limited area, and a protection function for a plurality of semiconductor elements may be provided by defining a plurality of diode elements in one transistor.

While example embodiments have been shown and described above, it will be apparent to those skilled in the art that modifications and variations could be made without departing from the scope of the inventive concept as defined by the appended claims.

What is claimed is:

1. A semiconductor device comprising:
 a guard active area formed in a substrate;
 a plurality of transistors disposed in an element area adjacent to the guard active area, each of the transistors comprising an active area and a gate structure; and
 a diode transistor disposed between a first transistor and a second transistor among the transistors, and comprising:
  a diode gate structure connected to the guard active area;
  a first active area connected to a gate structure of the first transistor; and
  a second active area connected to a gate structure of the second transistor.

2. The semiconductor device of claim 1, wherein the first active area forms a first antenna diode, and the second active area forms a second antenna diode, and
 wherein the guard active area is configured to provide a ground voltage to the diode gate structure.

3. The semiconductor device of claim 2, wherein the diode transistor is disposed between the first transistor and the second transistor in a first direction, and
 wherein the diode gate structure extends in a second direction crossing the first direction and connected to the guard active area.

4. The semiconductor device of claim 3, wherein the first active area and the second active area are disposed in different positions in the first direction and a second direction crossing the first direction.

5. The semiconductor device of claim 3, wherein the gate structure comprises an area extending in the first direction, and disposed between the diode transistor and the guard active area.

6. The semiconductor device of claim 3, wherein an interval between the gate structure of the transistors and the gate structure of the diode gate structure is equal to or less than a predetermined reference interval.

7. The semiconductor device of claim 1, wherein the first active area is disposed between the diode gate structure and the first transistor, and the second active area is disposed between the diode gate structure and the second transistor.

8. The semiconductor device of claim 1, wherein the diode transistor further comprises:
 a third active area disposed between the diode gate structure and the first transistor and adjacent to the first active area; and
 a fourth active area disposed between the diode gate structure and the second transistor and adjacent to the second active area.

9. The semiconductor device of claim 8, wherein the third active area is connected to a gate structure of a third transistor different from the first transistor and the second transistor, and the fourth active area is connected to a gate structure of a fourth transistor different from the first transistor, the second transistor and the third transistor.

10. The semiconductor device of claim 8, wherein the third active area and the fourth active area are floated.

11. The semiconductor device of claim 1, wherein the gate structure of each of the first transistor and the second transistor comprises a first gate area crossing the active area, and a second gate area extending from the first gate area and crossing the first gate area, and
wherein the second gate area is electrically connected to one of the first active area and the second active area through a metal line disposed in an upper portion of the diode transistor.

12. The semiconductor device of claim 11, wherein the second gate area is disposed between the transistors and the guard active area.

13. The semiconductor device of claim 1, further comprising a plurality of dummy gate structures between which the transistors are disposed.

14. A semiconductor device comprising:
a guard active area formed in a substrate;
a first transistor adjacent to the guard active area, and comprising an active area and a gate structure; and
a diode transistor adjacent to the guard active area and the first transistor, and comprising:
a diode gate structure extending in a first direction and connected to the guard active area; and
a first active area disposed between the diode gate structure and the first transistor, and connected to the gate structure of the first transistor.

15. The semiconductor device of claim 14, further comprising a second transistor disposed on an opposite side of the first transistor with respect to the diode transistor, and comprising an active area and a gate structure,
wherein the diode transistor further comprises a second active area disposed between the diode gate structure and the second transistor, and connected to the gate structure of the second transistor.

16. The semiconductor device of claim 14, wherein a size of the first active area is smaller than the active area of the first transistor.

17. The semiconductor device of claim 14, wherein the guard active area is doped with a P-type impurity, receives a ground voltage, and provides the ground voltage to the diode gate structure.

18. The semiconductor device of claim 14, wherein the guard active area is doped with an N-type impurity, receives a power supply voltage, higher than a ground voltage, and provides the power supply voltage to the diode gate structure.

19. A semiconductor device comprising;
a substrate;
a plurality of transistors formed in the substrate, and comprising an active area doped with a first conductivity type impurity and a gate structure crossing the active area;
a guard active area formed in the substrate, to be adjacent to the transistors, and doped with the first conductivity type impurity; and
a diode transistor comprising:
a diode gate structure connected to the guard active area; and
a first active area and a second active area disposed opposite sides of the diode gate structure, and configured to pass a current generated in a process of manufacturing the semiconductor device using plasma to the substrate.

20. The semiconductor device of claim 19, wherein the guard active area is biased to a ground voltage.

* * * * *